United States Patent [19]

Sasaki et al.

[11] 4,290,983

[45] Sep. 22, 1981

[54] PIEZOELECTRIC AND PYROELECTRIC FILM AND METHOD FOR PREPARING THE FILM

[75] Inventors: Tohru Sasaki; Syuuzi Terasaki; Tomoo Susa, all of Iwaki, Japan

[73] Assignee: Kureha Kagaku Kogyo Kabushiki Kaisha, Tokyo, Japan

[21] Appl. No.: 95,379

[22] Filed: Nov. 19, 1979

[30] Foreign Application Priority Data

Nov. 21, 1978 [JP] Japan ............................. 53-143735

[51] Int. Cl.$^3$ ............................................. B29C 17/02
[52] U.S. Cl. ............................. 264/22; 264/288.8; 264/290.2
[58] Field of Search ............ 264/22, 288.8, 290.2; 427/100, 12; 29/25.35; 179/111 E; 307/400; 310/357

[56] References Cited

U.S. PATENT DOCUMENTS

| | | | |
|---|---|---|---|
| 3,197,538 | 7/1965 | Capron et al. | 264/288.4 |
| 3,691,264 | 9/1972 | Asahina | 264/22 |
| 3,869,534 | 3/1975 | Yoshikawa et al. | 264/210.1 |
| 3,878,274 | 4/1975 | Murayama et al. | 264/24 |
| 3,931,446 | 1/1976 | Murayama et al. | 427/100 |
| 4,049,859 | 9/1977 | Yoshikawa et al. | 427/100 |
| 4,127,681 | 11/1978 | Ferren et al. | 264/22 |
| 4,134,957 | 1/1979 | Yoshimura et al. | 264/288.4 |

FOREIGN PATENT DOCUMENTS

| | | | |
|---|---|---|---|
| 51-18377 | 1/1976 | Japan | 264/22 |
| 52-38580 | 3/1977 | Japan . | |

*Primary Examiner*—James B. Lowe
*Attorney, Agent, or Firm*—Wegner & Bretschneider

[57] ABSTRACT

A piezoelectric and pyroelectric film made from a resin composition of polymer of vinylidene fluoride, which is characterized by an index of birefringence of larger than $3 \times 10^{-3}$ and a ratio of $d_{31}/d_{32}$ of 0.3 to 3.0, and which may be prepared by further stretching a biaxially stretched film made from the above-mentioned resin composition at a temperature lower than the temperature of the biaxially stretching by more than 20° C. before or at the same time of a treatment for orientation polarization of the film.

8 Claims, No Drawings

PIEZOELECTRIC AND PYROELECTRIC FILM AND METHOD FOR PREPARING THE FILM

This invention relates to a piezoelectric and pyroelectric film comprising resin composition of polymer of vinylidene fluoride and a method for preparing the film, and more particularly, the film obtained by after biaxially stretching further stretching the biaxially stretched film and the method for preparing the film.

As is well known, a film having a large piezoelectricity and a large pyroelectricity is relatively easily obtained by monoaxially stretching the unstretched film made from the composition of polymer of vinylidene fluoride. Accordingly, in cases where only a monodirectional stress is loaded on such a film, the monodirectionally stretched film above-mentioned is sufficient in use. However, since the film is strongly oriented only in one direction, the tensile strength of the film in the direction of stretching is more than $3 \times 10^3$ kg/cm$^2$, on the other hand its tensile strength to the direction at a right angle to the direction of stretching is as small as less than $6 \times 10^2$ kg/cm$^2$. Moreover, the film has a yield point within the elongation of 5 to 20% of the original length thus presenting thickened spots having a thickness of several hundred times of the thickness of the most thin part of the film when elongated more than 20% with a result of out of practical use. Further, such a film does not withstand a tiny impact as is shown below; using a Du Pont type Paint Film Impact Tester, placing the film specimen of 15 μm in thickness on the film holder having a circular depression of 20 mm in radius, dropping freely a steel hemi-spherical body of 13.5 mm in radius on the film from the height of H cm to determine the largest H where the film specimen does not break, the largest height which does not break the film was less than 50 mm.

Accordingly, the monoaxially stretched film is not sufficient for processing stage or use stage where a stress is applied on the film from all the direction, for instance, in use in a microphone, or where a strain generates from all the direction, for instance, in use in a speaker. Moreover, the piezoelectricity of the monoaxially stretched film after the treatment of orientation polarization is largely anisotropic, the piezoelectric constant in the direction perpendicular to the direction of stretching is as small as of about one tenth of the piezoelectric constant of the film in the direction of the stretching. Therefore, the monoaxially stretched film derived from polymer of vinylidene fluoride is not suitable from this point of view for the use which does not like the monodirectionality such as microphones and headphones.

For the use in which the monoaxially stretched film is not suitable, a biaxially stretched film is employed as an alternative, however, since the polymer of vinylidene fluoride is highly crystalline in nature, in the case where the film once stretched to a direction to have its crystals oriented is further stretched in the direction perpendicular to the first direction at a low temperature, the film becomes cracked not to obtain the biaxially stretched film. For that reason, the second stretching has been performed at a raised temperature of higher than 160° C. This second stretching at such a raised temperature, however, brings about a disadvantage that the piezoelectric constant of the biaxially stretched film is smaller than that of the monoaxially stretched film even after applying an electric field thereto as high as the threshold of dielectric breakdown at a temperature of around 100° C. which is the conditions of orientation-polarization for making the film to have the highest piezoelectric constant. In this case, when x-axis is taken as the direction of the first stretching, y-axis is taken as the direction of the second stretching and z-axis is taken as the direction of the thickness of the film, the most appropriate expression of the piezoelectric constant of the biaxially stretched film is considered to be $d_{31}+d_{32}$ for piezoelectricity due to the stretching and compressing strain in any direction in the surface of the film. According to the above-mentioned expression, the thus obtained biaxially stretched film of homopolymer of vinylidene fluoride shows at the highest value of $d_{31}+d_{32}$ of $1.3 \times 10^{-11}$ C/N. In cases of copolymer of vinylidene fluoride, the value is at the best of $2 \times 10^{-11}$ C/N. Similarly, the pyroelectric constant of the biaxially stretched film is at the best of $2.7 \times 10^{-9}$ coulomb/cm$^2$·°K. in the case of homopolymer of vinylidene fluoride and of $4.1 \times 10^{-9}$ coulomb/cm$^2$·°K. in the case of copolymer of vinylidene fluoride.

As is described above, although the piezoelectric property of the monoaxially stretched film of polymer of vinylidene fluoride is large in a specified direction, it is small in other directions, that is, the film is highly anisotropic, and both the piezoelectric property and the pyroelectric property of the biaxially stretched film of homo- or copolymer of vinylidene fluoride are small. It is sure that a biaxially stretched film higher in piezoelectric property and pyroelectric property is obtained by copolymer of vinylidene fluoride than the film obtained from homopolymer of vinylidene fluoride, on the other hand, the film prepared from the copolymer shows a smaller modulus of elasticity than the film prepared from the homopolymer. Accordingly, for the purpose in which the modulus of elasticy may be small, the copolymer film is possibly used, however, for the purpose in which the modulus of elasticity of the copolymer film is too small to be used, the homopolymer film is inevitably used. That is, the two films are not to be substituted each other.

Since the above-mentioned disadvantage of the conventional films has been elucidated, the film having both the smaller anisotropy and the larger piezo- and pyroelectricity has been eagerly expected in the field of this art, however, its realization has not been performed until the present and it was considered impossible to expect the realization. The present invention has its object of solving such a technical problem.

In short, the object of the present invention is to provide films prepared from homopolymers of vinylidene fluoride which have large piezo- and pyroelectricity and small anisotropy in piezoelectricity. Another object of the present invention is to provide films prepared from copolymers of vinylidene fluoride, which have larger piezo- and pyroelectricity than those of biaxially stretched film prepared from the copolymer of vinylidene fluoride and have smaller anisotropy than that of the monoaxially stretched film prepared from the copolymer of vinylidene fluoride. Still another object of the present invention is to provide films of homo- or copolymer of vinylidene fluoride having a large mechanical strength, piezo- and pyroelectricity and also a small anisotropy in mechanical and electrical properties.

In accordance with the above-mentioned objects, the present invention provides a piezoelectric and pyroelectric film made from a resin composition of polymer of vinylidene fluoride, which is characterized by an index of birefringence of larger than $3 \times 10^{-3}$ and a ratio of $d_{31}/d_{32}$ of 0.3 to 3.0. Furthermore, the present invention provides a method for preparing the above-mentioned film, which comprises biaxially stretching a film made from the resin composition of polymer of vinylidene fluoride, then additionally stretching the biaxially stretched film thus obtained at a temperature of lower than the crystalizing temperature of the resin composition, of lower than the temperature of the biaxiall stretching by more than 20° C. and of higher than the temperature of secondary transition of the resin composition and at the same time or after the additional stretching polarizing the additionally stretched film.

The biaxially stretched film referred in the present invention indicates a successively or simultaneously biaxially stretched film. The resin composition of polymer of vinylidene fluoride referred in the present invention indicates a homopolymer of vinylidene fluoride and/or copolymer of vinylidene fluoride containing more than 50 mole percent of vinylidene fluoride units in a polymeric main chain with at least one comonomer copolymerizable with vinylidene fluoride, for instance, a halogenoalkylene such as vinyl fluoride, tetrafluoroethylene, chlorotrifluoroethylene, etc. The resin composition may optionally include a compatible resin to the homo- or copolymer, for instance poly(methyl methacrylate), poly(methyl acrylate), etc. and a well known piezo- and pyroelectric substance, for instance, barium titanate, triglycine sulfate, etc.

In the present invention, the above-mentioned biaxially stretched film prepared from the resin composition of polymer of vinylidene fluoride is further stretched and the molecules of the polymer in the film are oriented. The additional stretching is carried out at a temperature of lower than the temperature of crystallization of the resin composition, lower than the temperature of the biaxial stretching by more than 20° C., preferably by more than 40° C., still more preferably by more than 60° C., and higher than the secondary transition temperature of the resin composition. Furthermore, the biaxially stretched film used for the present additional stretching is, in the case of successively biaxially stretched film, preferably the one which has its degree of molecular orientation of $14 \times 10^{-3}$ to $22 \times 10^{-3}$, preferably of $15 \times 10^{-3}$ to $19 \times 10^{-3}$, and still more preferably of $16 \times 10^{-3}$ to $18 \times 10^{-3}$ in the monoaxially stretched direction when being monoaxially stretched, and has its degree of molecular orientation of more than $-5 \times 10^{-3}$, preferably more than 0 in the biaxially stretched direction when being successively biaxially stretched. The degree of molecular orientation of the simultaneously biaxially stretched film used in the present invention is preferably more than $-5 \times 10^{-3}$, preferably more than 0 in the biaxially stretched direction. The degree of molecular orientation in the film referred herein means the difference between the refractive index in the concerned direction and the refractive index in the direction perpendicular to the former direction determined by a polarization microscope. Still more, the additional stretching referred herein includes not only the mere stretching in the direction perpendicular to the biaxial stretching, that is, in the direction of monoaxial stretching, in the direction of biaxial stretching or in the optionally oblique direction to the above-mentioned directions (hereinafter called as the third stage stretching) but also a multiple stage stretching which further includes one or more stretching steps after the third stage stretching. In the additional stretching of the present invention, the already biaxially stretched film may be stretched by at least 1.2 times, preferably more than 1.4 times.

The present invention includes the above-mentioned two steps of biaxial stretching and additional stretching, and a step of treatment for orientation polarization. In the present invention, for the orientation polarization of the molecules in the film, a known method of providing electrodes on the surfaces of the film and then applying a direct electrical field or treating the film with a corona discharge is utilized, and the temperature of the treatment for orientation polarization is higher than the secondary transition temperature (glass-transition temperature) of the resin compound and lower than the temperature of crystallization of the resin compound, preferably higher than the room temperature and lower than the temperature of crystallization, more preferably higher than the temperature of additional stretching and lower than the temperature of crystallization. Such a treatment for orientation polarization may be performed together with the commencement of the step of biaxial stretching or the step of additional stretching, during the above-mentioned two steps or after the step of additional stretching.

The film having an index of birefringence of more than $3 \times 10^{-3}$ and the value of $d_{31}/d_{32}$ of 0.3 to 3.0 may be easily obtainable by the above-mentioned process. The film having such an index of birefringence and a value of $d_{31}/d_{32}$ as shown above has a large value of a piezoelectric constant of $d_{31}+d_{32}$ and a pyroelectric constant with a small anisotropy, and sufficiently fulfills the objects of the present invention. Among such films, those having the index of birefringence larger than $5 \times 10^{-3}$, particularly larger than $7 \times 10^{-3}$ are able to have a larger piezo- and pyroelectricity, and they are preferably employed. The index of birefringence of the film is, however, preferably lower than $20 \times 10^{-3}$ in order to obtain a desirable piezoelectric isotropy of the film.

As shown in Examples below-mentioned, one of the most conspicuous advantages of the invention is that a film obtained by additionally stretching a biaxially stretched film is far richer in beta-form crystals of the molecule mainly constituted from polymeric chain of vinylidene fluoride than the same biaxially stretched film. Accordingly, it is easy to make the infrared absorbance ratio $D_{530}/D_{510}$ of the film less than 0.6, and it has become possible to improve the piezoelectricity and pyroelectricity of the thus obtained film as high as 80% over the conventional biaxially stretched film in the case of homopolymer of vinylidene fluoride. In the copolymer, although the conventional biaxially stretched film itself has already a relatively higher piezoelectricity and pyroelectricity, these properties are improved about 20% by the additional stretching of the present invention.

Moreover, concerning the mechanical toughness of the thus obtained film, owing to the nearly uniform orientation of the molecules mainly constituted from polymeric chain of vinylidene fluoride in all directions, the film is excellent in impact strength with smaller anisotropy of tensile strength. Still more, although the conventional biaxially stretched film prepared from the resin compound of homopolymer or copolymer of vinylidene fluoride has a large mechanical strength, the present invention offers a film of still larger mechanical strength.

The followings are the more detailed explanation of the present invention referring to the non-limiting examples.

EXAMPLE 1

A powdery poly(vinylidene fluoride) of which a solution in dimethylformamide at a concentration of 0.4 g/dl shows an inherent viscosity of 1.1 dl/g was melt-extruded and molded to be a sheet of 385 μm in thickness. The sheet thus obtained was monoaxially stretched by 2.8 times in the machine-direction at a temperature of 150° C. to have a degree of molecular orientation of $17.5 \times 10^{-3}$ in the direction of stretching. Then the stretched sheet was further stretched in the transverse direction by 5.5 times at a temperature of 173° C. using a tentor to obtain a biaxially stretched film with a degree of molecular orientation of $2.3 \times 10^{-3}$ in the direction of the second stretching. The ratio of infrared absorvence at 530 cm$^{-1}$ to infrared absorvence at 510 cm$^{-1}$ of the thus obtained film, i.e., $D_{530}/D_{510}$ was 1.3.

After further stretching this film in the machine-direction by 1.67 times at a temperature of 90° C., the degree of molecular orientation of the film was $14.4 \times 10^{-3}$ in the direction of the third stretching, i.e. the direction of the first stretching, and $D_{530}/D_{510}$ was changed to 0.55, which showing a strong predominancy of beta-form.

This film was subjected to electrical-deposition of aluminum as an electrode and polarized at a temperature of 100° C. under loading of a direct current of 1000 kV/cm while the temperature was reduced gradually from 100° C. to the room temperature. The thus aluminum-deposited three-stage stretched film of poly(vinylidene fluoride) did not show any break at a dropping-height of 60 cm on the test using a Du Pont type paint film impact tester, and showed a tensile strength of 3500 kg/cm² in the direction of the third stretching and of 1800 kg/cm² in the direction perpendicular to the third stretching-direction. Also its piezoelectric constants were as high as $d_{31} = 1.5 \times 10^{-11}$ C/N and $d_{32} = 0.83 \times 10^{-11}$ C/N, indicating that the film was nearly isotropic. In addition, its pyroelectric contant, dP/dT, was $4.7 \times 10^{-9}$ coulomb/cm².°K.

On the other hand, the above-mentioned biaxially stretched film of 25 μm in thickness, not yet subjected to the third stretching, was subjected to electrical deposition of aluminum and polarized by loading a direct current of 1000 kV/cm at a temperature of 100° C. while the temperature was reduced from 100° C. gradually to the room temperature. The piezoelectric constants of this biaxially stretched film were $d_{31} = 0.43 \times 10^{-11}$ C/N and $d_{32} = 0.87 \times 10^{-11}$ C/N. In addition, the pyroelectric constant of this biaxially stretched film was $2.7 \times 10^{-9}$ coulomb/cm².°K. Tensile strength of this biaxially stretched film was 1850 kg/cm² in the direction of the first stretching and 2400 kg/cm² in the direction of the second stretching. and 2400 kg/cm² in the direction of the second stretching.

EXAMPLE 2

Copolymeric powder comprising 96.5 parts by weight of vinylidene fluoride and 3.5 parts by weight of vinyl fluoride was melt-extruded and molded to be a sheet of 400 μm in thickness, and was stretched by 3.3 times in the machine-direction at a temperature of 145° C. to have a degree of molecular orientation of $16.5 \times 10^{-3}$ in the direction of stretching. Then the film was stretched by 5 times to the transverse direction at a temperature of 168° C. using a tentor to be a biaxially stretched film of 24.0 μm in thickness and of a degree of molecular orientation of $2.0 \times 10^{-3}$ in the direction of the second stretching. The ratio of $D_{530}/D_{510}$ of the thus obtained film was 0.21.

After further stretching this film in the machine-direction by 1.6 times at a temperature of 90° C. to obtain a film of 15 μm in thickness, of a degree of molecular orientation of $12.5 \times 10^{-3}$ in the direction of the third stretching and of a $d_{530}/D_{510}$ of 0.08.

After the film was subjected to vacuum evaporation of aluminum and polarized at a temperature of 115° C. under loading of a direct current of 1000 kV/cm while the temperature was reduced slowly from 115° C. to the room temperature, the this treated three-stage stretched film did not show break even at the dropping-height of 50 cm on the test using a Du Pont type paint film impact tester. The tensile strength of this film was 3300 kg/cm² in the direction of monoaxial stretching and 1900 kg/cm² in the direction perpendicular to the above-mentioned direction. The piezoelectric constants were $d_{31} = 1.7 \times 10^{-11}$ C/N and $d_{32} = 0.75 \times 10^{-11}$ C/N. The pyroelectric constant, dP/dT, of the film was $5.0 \times 10^{-9}$ coulomb/cm².°K.

On the other hand, the above-mentioned biaxially stretched film of 24 μm in thickness, not yet subjected to the third stretching, was subjected to vacuum evaporation of aluminum and polarized at a temperature of 115° C. under loading of a direct current of 1000 kV/cm while reducing the temperature gradually from 115° C. to the room temperature. The thus obtained film showed the following properties; piezoelectric constants of $d_{31} = 0.87 \times 10^{-11}$ C/N and $d_{32} = 1.2 \times 10^{-11}$ C/N, pyroelectric constant, dP/dT, of $4.1 \times 10^{-9}$ coulomb/cm².°K, and tensile strength of 1700 kg/cm² in the direction of the first stretching and 2200 kg/cm² in the direction of the second stretching.

EXAMPLE 3

Copolymeric powder used in Example 2 was melt-extruded and molded to be a sheet of 324 μm in thickness, and stretched monoaxially to the machine-direction by 3.6 times a temperature of 140° C. to obtain a degree of molecular orientation of $19 \times 10^{-3}$ in the direction of stretching. This film was further stretched in the transverse direction at a temperature of 171° C. by 4.0 times using a tentor to obtain a biaxially stretched film of a degree of molecular orientation of $-2.5 \times 10^{-3}$ in the direction of the second stretching, of 22.5 μm in thickness and $D_{530}/D_{510}$ of 0.55. This film was further stretched at a temperature of 100° C. in the transverse direction by 1.5 times to obtain a degree of molecular orientation of $10.5 \times 10^{-3}$ in the direction of the third stretching, i.e. the direction of the second stretching. The thus three-stage stretched film was of 15 μm in thickness and of 0.17 of $D_{530}/D_{510}$. After subjecting the film to vacuum evaporation of aluminum and polarization at 115° C. under a loading of a direct current of 1000 kV/cm while reducing the temperature from 115° C. to the room temperature, the thus treated film did not show any break even at a dropping-height of 50 cm on the test of Du Pont type paint film impact tester. The film showed a tensile strength of 1700 kg/cm² in the direction of monoaxial stretching direction and 3100 kg/cm² to the perpendicular direction to the monoaxial stretching. The piezoelectric constants and the pyroelectric constant were respectively $d_{31} = 0.83 \times 10^{-11}$ C/N and $d_{32} = 1.3 \times 10^{-11}$ C/N, and $4.4 \times 10^{-9}$ coulomb/cm$^2$·°K.

On the other hand, the above-mentioned biaxially stretched film, not yet subjected to the third stretching, was subjected to vacuum evaporation of aluminum and polarization under the same conditions as above. The thus treated film showed the following properties; the piezoelectric constants of $d_{31} = 0.93 \times 10^{-11}$ C/N and $d_{32} = 0.8 \times 10^{-11}$ C/N, the pyroelectric constant (dp/dT) of $3.6 \times 10^{-9}$ coulomb/cm$^2$·°K.

What is claimed is:

1. A method for preparing a piezoelectric and pyroelectric film comprising the steps of, biaxially stretching a film made from a resin composition of a polymer of vinylidene fluoride;

additionally stretching the thus obtained biaxially stretched film at a temperature of lower than the crystallizing temperature of said resin composition, which additional stretching temperature is lower than the temperature at the biaxially stretching by more than 20° C. and is higher than the secondary transition temperature of said resin composition; and at the same time or after the additional stretching polarizing the thus additionally stretched film 2. The method according to claim 1, wherein said resin composition comprises a homopolymer or copolymer of vinylidene fluoride.

3. The method according to claim 1, wherein the temperature at which said additional stretching is carried out is lower than the temperature at which biaxial stretching is carried out by more than 40° C.

4. The method according to claim 3, wherein said additional stretching is carried out at a temperature more than 60° C. below the temperature at which the biaxial stretching is carried out.

5. The method according to claim 1, wherein said additional stretching is carried out onto said biaxially stretched film in a state of molecular orientation of a degree higher than $-5 \times 10^{-3}$ in the direction of said biaxial stretching.

6. The method according to claim 1, wherein said biaxially stretched film prior to said additional stretching is in a state of molecular orientation of the degree of $14 \times 10^{-3}$ to $22 \times 10^{-3}$ in the direction of the first monoaxial stretching after the first monoaxial stretching constituting said biaxial stretching and is in a state of molecular orientation of a degree of higher than $-5 \times 10^{-3}$ in the direction of second monoaxial stretching after the second monoaxial stretching, said first and second monoaxial stretchings constituting said biaxial stretching.

7. The method according to claim 6, wherein the direction of said additional stretching is perpendicular to the direction of the second monoaxial stretching constituting said biaxial stretching or oblique to either of the direction of the first stretching or the second stretching.

8. The method according to claim 1, wherein said additional stretching is a multiple stage-stretching having two or more steps of stretching.

* * * * *